United States Patent [19]

Masuda et al.

[11] Patent Number: 4,862,246

[45] Date of Patent: Aug. 29, 1989

[54] SEMICONDUCTOR DEVICE LEAD FRAME WITH ETCHED THROUGH HOLES

[75] Inventors: Masachika Masuda, Kodaira; Akira Suzuki, Ohme, both of Japan

[73] Assignee: Hitachi, Ltd., Tokyo, Japan

[21] Appl. No.: 159,902

[22] Filed: Feb. 24, 1988

Related U.S. Application Data

[63] Continuation of Ser. No. 767,598, Aug. 20, 1985, abandoned.

[30] Foreign Application Priority Data

Sep. 26, 1984 [JP] Japan .................. 59-199563

[51] Int. Cl.⁴ .................................. H01L 23/48
[52] U.S. Cl. ...................... 357/70; 357/72; 357/73; 357/55; 357/68; 357/79; 428/596; 428/626; 174/52.2
[58] Field of Search ............ 357/70, 72, 73, 55, 357/68, 65, 79; 428/596, 626; 174/52 PE

[56] References Cited

U.S. PATENT DOCUMENTS

| | | | |
|---|---|---|---|
| 1,496,671 | 6/1924 | Gernsback | 357/79 X |
| 2,316,553 | 4/1943 | Brunke | 357/79 |
| 3,606,673 | 9/1971 | Overman | 357/65 X |
| 3,689,683 | 9/1972 | Paleho et al. | 357/70 X |
| 3,706,915 | 12/1972 | Lootens et al. | 357/68 X |
| 3,860,397 | 1/1975 | Segerson | 74/52 PE X |
| 3,900,813 | 8/1975 | Masuda et al. | 357/70 X |
| 4,026,008 | 5/1977 | Drees et al. | 357/70 X |
| 4,400,714 | 8/1983 | Brown | 357/70 |
| 4,445,271 | 5/1984 | Grabbe | 357/70 X |
| 4,589,010 | 5/1986 | Tateno et al. | 357/70 |
| 4,629,824 | 12/1986 | Gilder, Jr. et al. | 357/70 X |
| 4,637,130 | 1/1987 | Fujii et al. | 357/70 X |

FOREIGN PATENT DOCUMENTS

| | | | |
|---|---|---|---|
| 52-19971 | 2/1977 | Japan | 357/68 X |
| 54-101264 | 8/1979 | Japan | 357/68 X |
| 55-107252 | 8/1980 | Japan | 357/70 X |
| 55-107251 | 10/1980 | Japan | 357/70 X |
| 57-96561 | 6/1982 | Japan | 357/70 X |
| 58-48953 | 3/1983 | Japan | 357/70 X |
| 58-178545 | 10/1983 | Japan | 357/70 X |
| 59-104147 | 6/1984 | Japan | 428/596 X |
| 59-177952 | 10/1984 | Japan | 428/596 X |

*Primary Examiner*—William A. Mintel
*Attorney, Agent, or Firm*—Antonelli, Terry & Wands

[57] ABSTRACT

Those portions (i.e., the inner lead portions) of the leads of a semiconductor device, which are sealed by a package, are formed with a plurality of depression in at least the surfaces and backs thereof such that the depressions have a smaller diameter at their bottoms than at their surfaces. As a result, both the adhesion strength between a sealer as the package and the inner lead portions of the leads and the mechanical strength of the leads are improved even in a semiconductor device having numerous leads. Moreover, the inner lead portions can be formed in their sides with a number of notches, which can be combined with those depressions to better improve the adhesion strength between the sealant and the inner lead portions of the leads and the mechanical strength of the leads.

7 Claims, 6 Drawing Sheets

SEMICONDUCTOR DEVICE LEAD FRAME WITH ETCHED THROUGH HOLES

This is a continuation of application Ser. No. 767,598 filed Aug. 20, 1985, now abandoned.

BACKGROUND OF THE INVENTION

The present invention relates to a semiconductor device, a fabricating process therefor, and a lead frame to be used directly in the fabricating process.

Figure 6A:
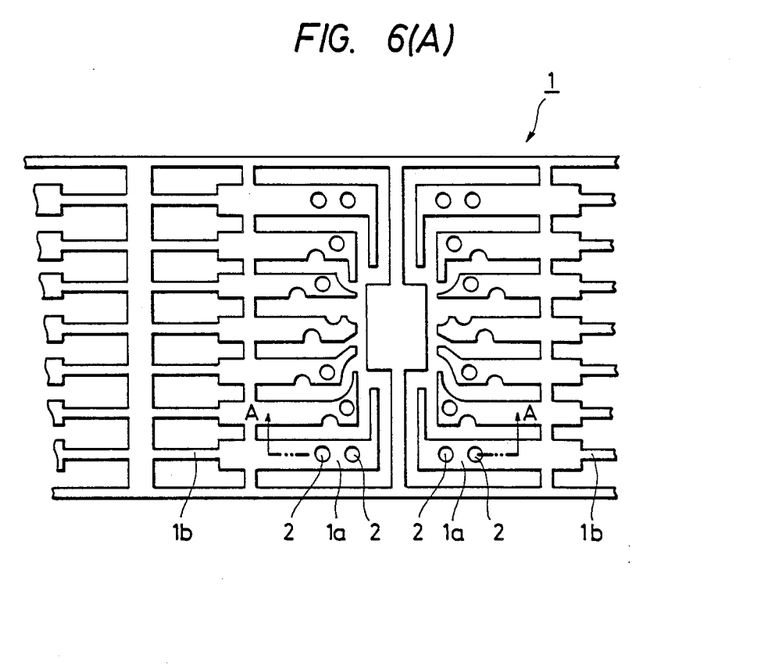
FIGS. 6(A) and 6(B) are a top plan view for explaining the problems of the lead frame to be used in a resin-sealed type semiconductor device and a section taken along line A—A, respectively.
Figure 6B:
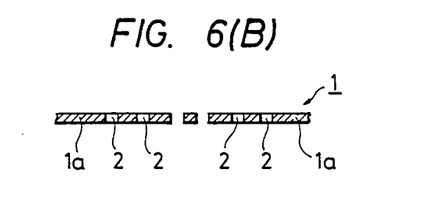

In a lead frame to be used in a semiconductor device having a semiconductor chip such as a large-scale integrated circuit (i.e., LSI) sealed with a resin or glass, as shown in FIGS. 6(A) and 6(B), it is conceivable to form column-shaped through holes (or lock holes) 2 in inner lead portions 1a of a lead frame 1 by a pressing technique. The lock holes improve the adhesion strength of the boundaries between a resin sealant and the inner lead portions 1a to prevent both those cracks of leads composed of the inner and outer lead portions 1a and 1b in the resin sealer, which might otherwise be caused by either an external force applied to the leads and the sealer or a stress due to the temperature cycle, and the steam of moisture from the gaps between the leads and the resin sealer.

The degree of integration has greatly increased in recent years for semiconductor devices having many pins, e.g., 32, 64, 100 or more. However, the inner lead portions 1a used in the semiconductor device may have a width as small as 0.2 mm. This is the case in semiconductor devices employing the flat plastic package (i.e., FPP) configuration. If the aforementioned fixing through holes 2 are formed in the inner lead portions 1a by a pressing technique, they take a columnar shape which makes the corresponding leads very weak. As a result the mechanical strength of the inner lead portions 1a is greatly reduced. If the stress from the outside of the leads or the resin sealer or the stress due to the temperature cycle is applied, it has been clarified by our investigations that the leads warp, that the cracks and gaps are formed between the sealer and the leads, and that the leads may be liable to come out of the sealer due to the reduction in the adhesiveness.

SUMMARY OF THE PRESENT INVENTION

An object of the present invention is to provide a novel semiconductor device, which is reliable, and which has excellent resistance to humidity, by improving the adhesion and mechanical strengths between a sealer and the leads, and a novel process for fabricating the semiconductor device.

Another object of the present invention is to provide a novel lead frame which can improve the adhesion and mechanical strength between the sealer and the leads and can be used to fabricate a highly reliable device.

The above described objects as well as other objects and novel and distinctive features of the present invention will be made clear by the detailed specifications and the accompanying drawings.

Representatives of the inventions to be disclosed herein will be summarized in the following.

Those portions (i.e., the inner lead portions) of the leads of a semiconductor device, which are sealed by a package, are formed with a plurality of depressions in at least the surfaces and backs thereof such that the depressions have a smaller diameter at their bottoms than at their surfaces. As a result, both the adhesion strength between a sealer as the package and the inner lead portions of the leads and the mechanical strength of the leads are improved even in a semiconductor device having numerous leads. Moreover, the inner lead portions can be formed in their sides with a number of notches, which can be combined with those depressions to better improve the adhesion strength between the sealer and the inner lead portions of the leads and to improve the mechanical strength of the leads.

BRIEF DESCRIPTION OF THE DRAWINGS

The aforementioned and other objects and the novel features of the present inventions will become apparent in view of the description to be made hereinafter with reference to the accompanying drawings, in which:

FIGS. 1(A) to 1(D) and FIGS. 2(A) to 2(C) show the construction of a lead frame of a semiconductor device according to an Embodiment I of the present invention:

DESCRIPTION OF THE PREFERRED EMBODIMENTS

The present invention will be described specifically in the following in connection with the embodiments thereof.

In the drawings for explaining the embodiments of the present invention, incidentally, parts having identical functions are indicated at identical reference numerals, and their repeated explanations are omitted.

[Embodiment I]

Figure 1A:
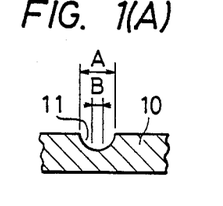
FIGS. 1(A) to 1(D) are enlarged sections showing an essential portion of the lead frame.
Figure 1B:
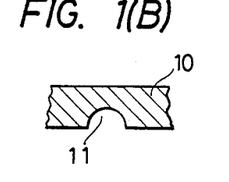
Figure 1C:
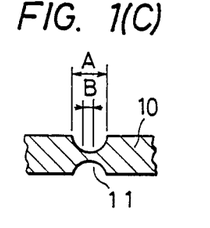
Figure 1D:
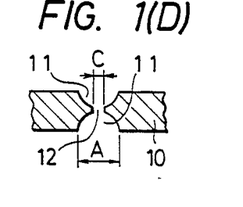
Figure 2A:
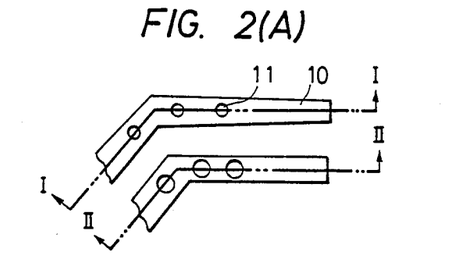
FIGS. 2(A) to 2(C) are respectively a top plan view showing a plurality of essential portions of FIG. 1 and sections taken along lines I—I and II—II.
Figure 2B:
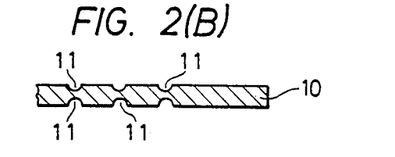
Figure 2C:
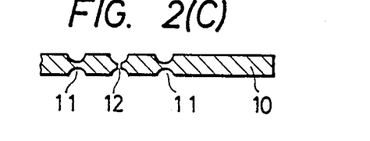

FIGS. 1(A) to 1(D) and FIGS. 2(A) to 2(C) are views showing the construction of a lead frame of a semiconductor device according to an Embodiment I of the present invention. FIGS. 1(A) to 1(D) are enlarged sections showing an essential portion of the lead frame. FIG. 2(A) is a top plan view showing an inner lead formed with a plurality of essential portions shown in FIG. 1. FIG. 2(B) is a section taken along line I—I of FIG. 2(A). FIG. 2(C) is a section taken along line II—II of FIG. 2(A).

In FIGS. 1(A) to 1(D) and FIGS. 2(A) to 2(C), reference numeral 10 indicates inner lead portions of a lead frame, and numeral 11 indicates lead fixing semispherical depressions (which will be shortly referred to as "depressions") which are formed in the surfaces or backs of the inner lead portions 10 of the aforementioned lead frame. The depressions 11 have a smaller bottom size B than their surface- or back-side size A (i.e., B<A). The depressions 11 are formed by isotropic etching. Indicated at numeral 12 are through holes which are formed as a result that the depressions at the surface side and the depressions at the back side are caused to contact by overetching when the depressions are formed by the etching technique from the two sides of the inner lead portions of the leads and which have a smaller size C than the size A of the surface- or back-side size A (i.e., C<A). In case the lead frame is made of a 42 alloy material, it can be formed with the depressions by the isotropic etching technique if the etching liquid used is ferric chloride.

By forming the aforementioned depressions 11 in both sides of the inner lead portions 10 of the lead frame, as shown in FIG. 2(B), a sealer (although not shown) of an epoxy resin or the like flows to set in the depressions 11 so that the adhesion and mechanical strengths between the sealer and the inner lead portions 10 of the lead frame are enchanced. In the combination of the aforementioned depressions and through holes, as shown in FIG. 2(C), on the other hand, adhesion strength can be further enhanced by the action similar to the aforementioned one while a similar mechanical strength is retained. When the sealer flows into and sets in the through holes 12, the adhesion strength between the sealer and the leads is far higher than that the case in which the depressions 11 are used.

Even if the depressions 11 or the through holes 12 are formed, the strength of the leads 10 is not reduced much. This is because the depressions 11 or the through holes 12 are smaller at the bottoms of the depressions 11 or at the centers of the through holes 12 than at the surfaces of the inner leads. For this sizing purpose, the depressions 11 are formed by isotropic etching, and the through holes 12 are formed by overetching technique. The fine leads can be worked by etching but not by pressing.

The leads formed with the through holes 12 become more or less weaker than the leads of FIG. 1(C). The strength of the leads 10 as a whole in case a greater number of depressions 11 and a smaller number of through holes 12 are formed together is substantially equal to that in case only the depressions 11 are formed.

[Embodiment II]

Figure 3A:
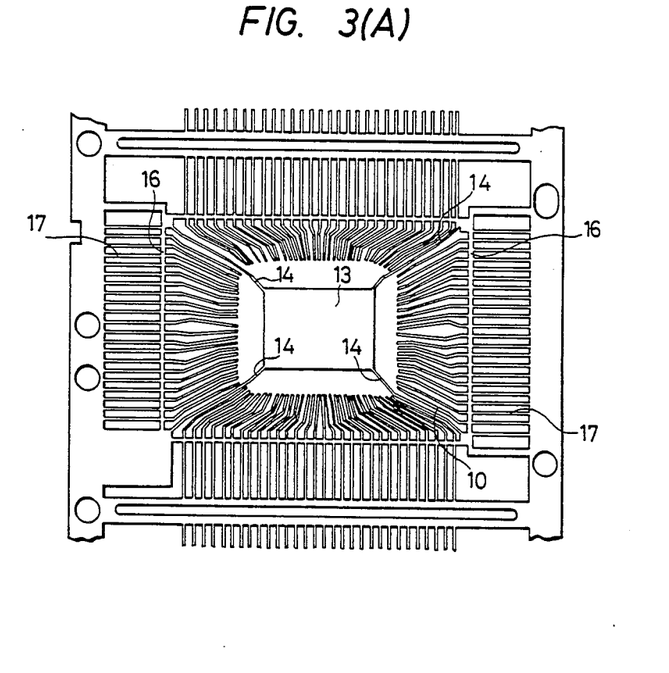
FIGS. 3(A) and 3(B) are top plan views for explaining the construction of the lead frame of a semiconductor device according to an Embodiment II of the present invention.
Figure 3B:
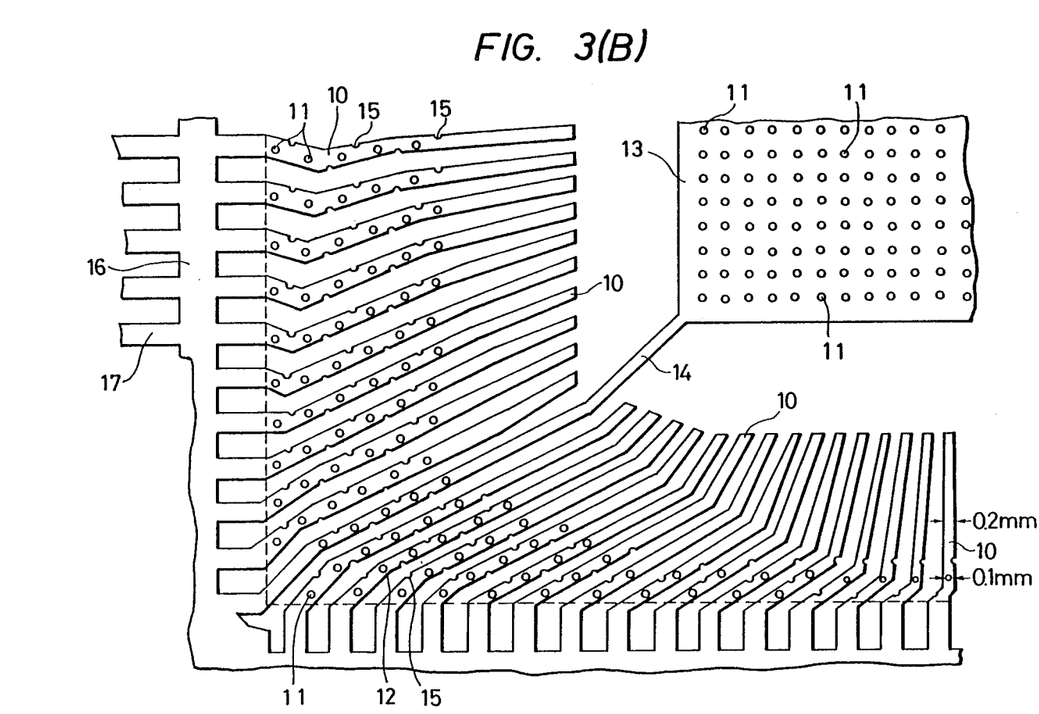

FIG. 3 is a view for explaining the construction of a lead frame for the FPP type semiconductor device according to an Embodiment II of the present invention. FIG. 3(A) is a top plan view showing a portion of the lead frame, and FIG. 3(B) is an enlarged top plan view showing a portion of FIG. 3(B). FIGS. 4(A) to 4(D) are enlarged perspective views showing such a region of the inner lead portion of the lead frame used in the present Embodiment II as is formed with a notch.

In FIG. 3: reference numeral 13 indicates a rectangular tab for mounting a semiconductor chip; numeral 14 identifies tab suspension leads connected with the four corners of the tab 13; numeral 15 indicates notches; numeral 16 indicates tie bars; numeral 17 indicates outer lead portions of the leads. Broken lines appearing in the drawings indicate regions which are covered with a sealer such as a resin or glass when the lead frame is sealed.

The lead portions for the semiconductor device according to the present Embodiment II are arranged, as shown in FIG. 3, with a number of narrow and thin leads having a width of 0.2 mm and a thickness of 0.15 mm. The inner lead portions 10, the tab suspension leads 14 and the tab 13 are formed with the depressions having a surface diameter of 0.1 mm, as shown in FIG. 1(C), and the through holes 12 formed in the bottoms of the depressions 11 by overetching the lead, as shown in FIG. 1(D), and the notches 15 shown in FIG. 4(D).

Thanks to these constructions, the sealer flows into and sets in the depressions of the surface, back and right and left sides of the inner lead portions 10 of the leads so that these inner lead portions 10 are fixed in four directions, i.e., upward, downward, rightward and leftward to further strengthen the adhesion between the lead and the sealer.

[Embodiment III]

Figure 3C:
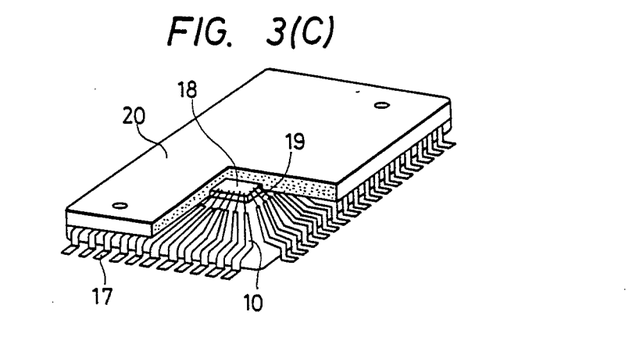
FIG. 3(C) is a partially cutaway perspective view showing the semiconductor device according to the Embodiment II of the present invention.
Figure 4A:
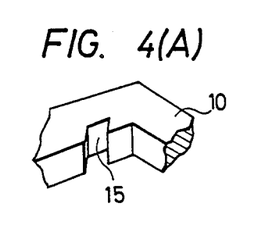
FIGS. 4(A) to 4(D) are enlarged perspective views showing an essential portion of a lead to be used in the Embodiment II.
Figure 4B:
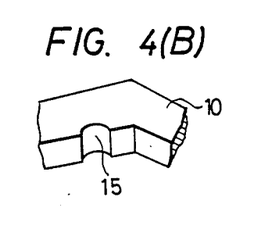
Figure 4C:
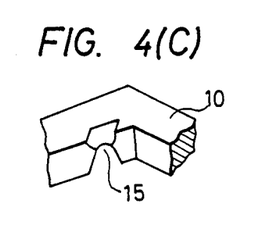
Figure 4D:
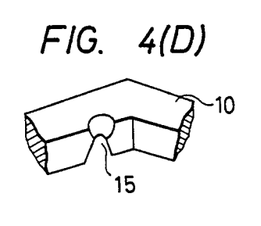
Figure 5:
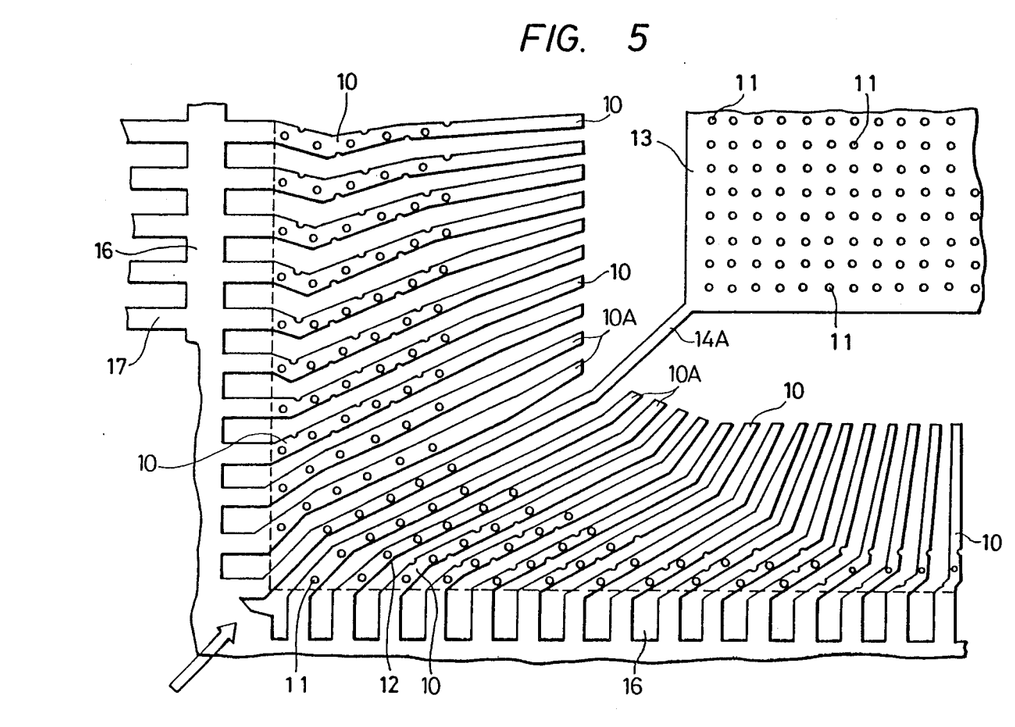
FIG. 5 is a top plan view for explaining the construction of a lead frame for the semiconductor device according to an Embodiment III of the present invention.

FIG. 3(C) is a partially cutaway perspective view showing an FPP type semiconductor device in which the lead frame shown in FIGS. 3(A) to 3(C) is used and sealed by means of a resin. In FIG. 3(C): reference numeral 18 indicates an LSI chip which is pellet-bonded to the tab 13 of the lead frame; numeral 19 indicates bonding wires electrically connecting the pad electrodes of the chip 18 and the inner lead portions 10; and numeral 20 indicates a resin sealer. The FPP (i.e., Flat Plastic Package) type semiconductor device has an increased number of bends in the outer lead portions 17 and a reduced number of contacting portions between the sealing resin and the leads. Therefore, a highly reliable device which is highly resistant to humidity and which has excellent heat resistance can be fabricated by applying the technical concept of the present invention. The Embodiment III of the present invention is similar to the lead frame of the foregoing Embodiment II, but those inner lead portions 10A of the leads, which are required to have mechanical strength, are not formed with any of the notches, as shown in FIG. 5. The present Embodiment III is different in this point from the Embodiment II. In short, the tab suspension leads 14A and the plural inner lead portions 10A in the vicinity of the former are formed with depressions 11 or the through holes 12 only.

When the FPP type semiconductor device is to be sealed, a resin is injected from the gate of the mold into the cavity between the top and bottom parts of the mold. This injection of resin is conducted in the direction of arrow, as shown in FIG. 5. The pressure of the resin injected is applied to the leads in the vicinity of the gate. Therefore, these leads are required to have a higher strength than the remaining leads 10.

Thus, by forming the aforementioned depressions 11, the through holes 12 and the notches 15 to be formed in the inner lead portions 10 and 10A, if necessary, better integration of the leads and the mold resin acting as a sealant can be attained to improve the reliability and prolong the working life of the semiconductor device.

The process for fabricating the semiconductor device according to the present invention is summarized, as follows. Specifically, the process for fabricating a semiconductor device, comprises: the step of preparing a lead frame in which leads have their inner lead portions formed with a plurality of depressions in at least the surfaces and backs thereof; the step of pellet-bonding a pellet, which is formed with a semiconductor integrated circuit composed mainly of a semiconductor element, to a tab of said lead frame; the step of wire-bonding each of the bonding pads of said pellet and the corresponding lead of said lead frame by means of a thin metal wire;

the step of sealing said pellet, said thin metal wire and the inner lead portions of the leads of said lead frame by means of a resin to form a resin sealer; and the step of cutting and removing an unnecessary portion from said lead frame.

On the other hand, the lead frame of the present invention is summarized, as follows. Specifically, the lead frame comprises: a tab for placing thereon a pellet which is formed with an electric circuit composed mainly of a semiconductor element; a plurality of leads arranged around said tab; a frame enclosing said leads and fixing the respective ones of said leads; and tie bars arranged in said frame and connecting the respective ones of said leads, wherein the improvement resides in that the inner lead portions of said leads, which are located at the nodes connected with said tie bars, are formed with a plurality of depressions in at least the surfaces and backs thereof.

The present invention has the following major modes of modifications.

In the lead frame, said depressions are etched.

In the lead frame, the back of said tab, on which said pellet is not placed, is formed with a plurality of depressions.

In the lead frame, a plurality of said depressions are formed in both the surfaces and backs of the inner lead portions of most of said leads.

In the lead frame, a plurality of said depressions are formed in both the surfaces and backs of the inner lead portions of all said leads.

In the lead frame, the sides of the inner lead portions of most of said leads are formed with a plurality of notches.

In the lead frame, a plurality of said depressions are formed in both the surfaces and backs of the inner lead portions of most of said leads, wherein the bottoms of some of the depressions, which are formed in the surfaces of said inner lead portions, and the bottoms of some of the depressions, which are formed in the backs of said inner lead portions, contact each other, and wherein the contacting portions are formed with through holes.

In the lead frame, said depressions are circular in top plan views and are arcuate in section.

As has been described hereinbefore, according to the novel technical means disclosed herein, the following effects can be attained.

(1) Since the inner lead portions of the lead frame for the semiconductor device are formed with a plurality of the depressions and since these depressions are made to have a smaller diameter at their bottom than at the surface side, the adhesion strength between the sealer such as the mold resin and the inner lead portions of the leads can be improved without any reduction in the mechanical strength of the leads even if these leads are thin.

(2) Since the depressions are formed by the etching work and the through holes are formed by the overetching work, they can be formed easily even in those fine leads having a thickness of 0.15 mm and a width of 0.2 mm without reducing the mechanical strength of the leads.

(3) Since the depressions or the through holes are formed by isotropic etching, their size can be easily made smaller at the bottom than at the surface.

(4) Since the through holes are shaped into pores, as shown in FIG. 1(D), the adhesion between the leads and the sealer can be strengthened without any substantial reduction in the mechanical strength of the leads.

(5) Since the depressions, the through holes and the notches are suitably selected and combined, the adhesion strength and the mechanical strength between the sealer and the inner lead portions of the leads can be enhanced.

(6) Since the depressions and the through holes are formed alternately in one lead, the adhesion between the lead and the sealer can be improved without any reduction in the mechanical strength of the lead.

(7) In the modification in which the mechanical strength can be made higher at the leads in the vicinity of the gate for injection of the resin than at the remaining leads by not forming the notches, the leads can be prevented from being deformed during resin injection.

(8) Even a semiconductor device having an especially small lead width such as an FPP type semiconductor device can be made more reliable.

(9) Since it is possible to prevent the leads from being bent and from coming out of the sealant and to prevent the sealant from cracking even if the leads are subjected to external mechanical stress or to thermal stress, it is possible to improve the reliability and prolong the working life of the semiconductor device.

Although the present invention has been described specifically in connection with the embodiments thereof, it should not be limited thereto but can naturally be modified in various ways without departing from the gist thereof.

For example, the positions of the leads, in which the aforementioned depressions, through holes and notches are to be formed, should not be limited to those of the embodiments but can be selected, as desired. Moreover, it is evident that the present invention can be applied to semiconductor devices other than the resin-sealed type, for example, to a glass-sealed semiconductor device.

What is claimed is:

1. A semiconductor integrated circuit device comprising:
   a semiconductor integrated circuit pellet having a plurality of bonding pads on a major surface thereof;
   a plurality of conductive leads having inner end portions which extend to the vicinity of the pellet;
   a plurality of connecting wires, one end of each of said wires being connected to one of the pads and the other ends of said wires being connected to the inner end portions of the leads;
   a resin encapsulation body sealing the pellet, connecting wires, and the inner end portions of the leads; and
   wherein a plurality of the inner end portions of said leads each have a plurality of semispherical depressions formed by etching to have a smaller diameter at the bottom of said semispherical depressions than at the surface side of said semispherical depressions, and said plurality of inner end portions of said leads having said semispherical depressions each further have at least one through hole in the vicinity of the periphery of the resin body formed therein between depressions on opposite sides of the inner end portion by overetching when said semispherical depressions are formed by etching, the diameter of the through hole being smaller than the diameter of the depressions at the surface side of said depressions, such that the resin material of said body fills said through holes of said plurality of inner end portions of said leads, both said semispherical depressions and said at least one through hole on said leads enhancing the adhesion and mechanical strength between said resin material and said inner end portions without any substantial reduction in the mechanical strength of said inner end portion.

2. A semiconductor integrated circuit device according to claim 1, wherein said pellet is secured on a tab.

3. A semiconductor integrated circuit device according to claim 1, wherein the inner end portions of all of said plurality of conductive leads each have at least one through hole formed by etching.

4. A semiconductor integrated circuit device according to claim 1, wherein the etching is a chemical etching.

5. A semiconductor integrated circuit device according to claim 1, wherein the etching is performed from the surfaces and backs of the inner lead portions of said leads.

6. A semiconductor integrated circuit device according to claim 1, wherein said depressions are formed in at least the surfaces and backs of said inner end portions of said leads.

7. A semiconductor integrated circuit device according to claim 1, further comprising a tab on which said pellet is placed, the back of said tab also being formed with a plurality of depressions in which said resin is buried.

* * * * *